(12) United States Patent
Pazidis et al.

(10) Patent No.: US 8,339,575 B2
(45) Date of Patent: Dec. 25, 2012

(54) OFF-AXIS OBJECTIVES WITH ROTATABLE OPTICAL ELEMENT

(75) Inventors: Alexandra Pazidis, Aalen (DE); Aksel Goehnermeier, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1009 days.

(21) Appl. No.: 12/206,550

(22) Filed: Sep. 8, 2008

(65) Prior Publication Data

US 2009/0073412 A1    Mar. 19, 2009

Related U.S. Application Data

(63) Continuation of application No. PCT/EP2007/052105, filed on Mar. 6, 2007.

(30) Foreign Application Priority Data

Mar. 7, 2006  (DE) .......................... 10 2006 010 337

(51) Int. Cl.
*G02B 7/02* (2006.01)
*G03B 27/32* (2006.01)
*G03B 27/42* (2006.01)
*G03B 27/54* (2006.01)
*G03B 27/72* (2006.01)

(52) U.S. Cl. ................. 355/67; 355/53; 355/71; 355/77; 359/813

(58) Field of Classification Search .... 250/492.1–492.2; 355/52–53, 67–68, 71, 77; 359/683, 685, 359/813–814, 819–820
See application file for complete search history.

(56) References Cited

U.S. PATENT DOCUMENTS

| 5,969,802 | A | 10/1999 | Takahashi et al. |
| 6,404,482 | B1* | 6/2002 | Shiraishi ......................... 355/53 |
| 6,842,293 | B1 | 1/2005 | Yin et al. |
| 2003/0189696 | A1* | 10/2003 | Sumiyoshi et al. ............. 355/67 |
| 2005/0219707 | A1 | 10/2005 | Schuster et al. |
| 2006/0001854 | A1* | 1/2006 | Singer et al. .................... 355/67 |
| 2006/0077366 | A1 | 4/2006 | Shafer et al. |

FOREIGN PATENT DOCUMENTS

| DE | 1995 63 54 A1 | 6/2001 |
| DE | 103 43 333 A1 | 4/2005 |
| JP | 62103599 A | 5/1987 |
| JP | 2002 208 549 A1 | 7/2002 |
| JP | 2005 085842 | 3/2005 |
| WO | 02/46823 A2 | 6/2002 |

\* cited by examiner

*Primary Examiner* — Hung Henry Nguyen
*Assistant Examiner* — Colin Kreutzer
(74) *Attorney, Agent, or Firm* — Sughrue Mion, PLLC

(57) ABSTRACT

An objective and a method for operating an objective, in particular a projection objective or an illumination objective for microlithography for imaging a reticle onto a wafer, with a plurality of optical elements that are arranged along a ray path, wherein at least one optical element of a first kind (1) is provided, which is irradiated only partially by a ray bundle, wherein the one or more optical element(s) of the first kind are rotatably mounted or positionable about the optical axis or an axis parallel thereto, wherein, for each optical element of the first kind at least two mounting positions are provided, and wherein the rotation angle between the two mounting positions is defined by the surface (7) irradiated by the ray bundle such that, in the various mounting positions, the surfaces irradiated by the ray path do not overlap.

15 Claims, 3 Drawing Sheets

OFF-AXIS OBJECTIVES WITH ROTATABLE OPTICAL ELEMENT

This is a Continuation of International Application PCT/EP2007/052105, with an international filing date of Mar. 6, 2007, which was published under PCT Article 21(2) in German, and the complete disclosure of which is incorporated into this application by reference.

FIELD AND BACKGROUND OF THE INVENTION

The present invention relates to an objective and especially to a projection objective or illumination objective for microlithography for imaging a reticle onto a wafer, and to a method for operating such an objective.

RELATED ART

For the production of microstructured or nanostructured components in electrical technology, lithography systems are employed in which a reticle having a specific structure is illuminated and imaged via a projection objective on a wafer on which the structure is to be generated. By means of corresponding photosensitive layers, the microstructures and nanostructures can thus be generated on a wafer. Corresponding systems comprising an illumination system for illuminating the reticle and a projection objective for imaging the reticle onto the wafer are called projection exposure systems.

The projection objectives used in this way or the projection exposure systems overall thus require a very high accuracy, with even the slightest changes at the objective or a corresponding projection device generally capable of producing imaging errors which lead to undesirable deviations in the structures generated. For example, the optical elements may become contaminated with salt deposits or deposits of $SiO_2$ layers. To prevent this, U.S. Pat. No. 5,969,802 A1 proposes providing a corresponding inert gas in the objective space. However, this entails considerable outlay with regard to introducing the gas into the objective space and maintaining the gas composition in the objective space. In addition, allowance must be made for the fact that the optical properties of the gas must be appropriate for the design of the objective.

In addition, aging phenomena in the optical elements, particularly also as a result of the irradiation of the optical elements of the objective with the chosen light, for example, UV light, may bring about changes which impair the optical properties.

In the art, such damage to optical elements may be remedied by replacing the same or by introducing correction elements. However, this also entails a high outlay.

In order to resolve this problem, DE 1995 63 54 A1 furthermore proposes that optical elements be rotatably configured such that rotation of the optical elements during exposure avoids or at least compensates for asymmetric introduction of error sources, for example, arising from photo-induced or thermally-induced degradation of the optical elements. Such a method also entails a high outlay, however, since the optical element must be rotated during the exposure.

A similar method is described in JP 2002 208 549 A1, wherein the number of light pulses and the optical properties of the system are measured, in order that this information may serve as a basis for rotating an optical element. The metrology and control technology used in this method increases the outlay further again.

U.S. Pat. No. 6,842,293 B1 describes a beam expander for expanding high-intensity laser beams, such as UV laser beams, by means of a mirror arrangement. Here, again, the harmful influence of the radiation is counteracted by a rotating-mirrors configuration, such that an area damaged by radiation can be moved out of the ray path and an undamaged area on the same optical component can be used. As a result, the life of the device can be significantly increased.

US 2005/0219707 A1 describes in turn a projection objective for a microlithographic projection exposure system with a correction device for compensating photo-induced imaging errors. For this purpose, a liquid for adjusting the refractive indices can be provided or removed from between two optical elements, one of which can have a surface deformation for the purpose of correcting the imaging properties, in order that the effect of the surface deformation may, as it were, be turned on and off. In addition, it describes optical elements, which can rotate towards each other and in turn can have surface deformations, which can be mutually rotated or spatially arranged so as to correct photo-induced damage and resulting imaging errors in such a way that, to an extent depending on the position of the two optical elements, through superposition of the imaging effected by the surface deformations, a compensation effect is either present or turned off.

In addition, WO 02/46823 A2 discloses modifiable optical filters in which different filter areas are formed on a mobile filter element, such that a corresponding movement and orientation of the filter with respect to the ray path moves different filter areas into the ray path to produce the various desired filter effects there.

OBJECT OF THE INVENTION

An object of the present invention is to provide an objective or a projection device generally which, preferably in a relatively simple manner, allows aging damages to be taken into account and, with relatively simple arrangements, ensures highly accurate imaging over a long service life in an efficient and cost-effective manner.

SUMMARY

This object is achieved with an objective and a method for operating an objective, in particular a projection objective or an illumination objective for microlithography for imaging a reticle onto a wafer, with a plurality of optical elements that are arranged along a ray path, wherein at least one optical element of a first kind is provided, which is irradiated only partially by a ray bundle, wherein the one or more optical element(s) of the first kind are rotatably mounted or positionable about the optical axis or an axis parallel thereto, wherein, for each optical element of the first kind at least two mounting positions are provided, and wherein the rotation angle between the two mounting positions is defined by the surface irradiated by the ray bundle such that, in the various mounting positions, the surfaces irradiated by the ray path do not overlap, at least entirely.

In the following, by objective is understood an imaging device generally, which, for example, can be an illumination device of a projection exposure system for microlithography or a corresponding projection objective. Objective is therefore not to be understood in the narrow sense that merely an object can be imaged with it. Rather, it can also be an illumination device in a microlithography projection exposure system with which the light from a light source, such as a laser, having light in the ultraviolet to extreme ultraviolet (EUV) wavelength range, is processed such that it impinges on the reticle to be imaged, in a defined, homogenous distribution and at specific angles. Since non-rotationally symmetrical illumination settings, such as dipole or quadrupole illumination settings, can be chosen especially in the case of such illumination devices, the present invention is especially advantageous for illumination systems of microlithography projection exposure systems. Preferred embodiments can be provided particularly in pupil planes, planes close to the pupils or planes conjugated therewith. Also advantageous is use in field planes, planes close to fields or planes conjugated therewith in the case of off-axis projection objectives, in which the illumination field is offset from the optical axis.

The inventors have recognized that the prior art solution of an objective with rotating optical elements (DE 199 563 54 A1) can be developed further such that the rotatability of optical elements is used especially for optical elements in an objective, which are arranged in the ray path of an objective such that they are irradiated only partially by a ray bundle during imaging, such that only part of the optical element is optically active, that is, exposed to the irradiation.

Accordingly, photo-induced aging phenomena will also occur only in the irradiated area. Thus, after a certain period in operation, there are still areas of the optical element which are undamaged and can be used for unimpaired imaging.

Contrary to DE 1995 63 54 A1, however, it is necessary to protect these areas against photo-induced degradation precisely through the avoidance of constant rotation. Thus, after the occurrence of damage which leads to impairment of imaging and which, for example, exceeds a specific threshold value, the optical element is rotated or positioned in a rotated manner such that a totally undamaged part of the optical element is arranged in the ray path, such that this undamaged part is irradiated.

Accordingly, at least one, preferably several, optical elements of a first kind are provided in such an objective which are irradiated only partially and are mounted rotatably such that at least two, preferably several, mounting positions are provided, which can be adopted through rotation about the optical axis or an axis parallel to the optical axis and in which the irradiated areas do not overlap. This ensures that, through rotation from one mounting position into another mounting position, an area of the optical element moves into the irradiated area, said area of the optical element not having any photo-induced aging stress whatsoever.

This principle is applicable, however, not only to photo-induced aging damage, but also with regard to other environment-induced damage. For instance, an optical element which is in contact with an immersion liquid might be attacked by the immersion liquid. In this case, those areas of the optical element which are not needed for imaging, are initially furnished with a protective layer or protective film in order that impairment by environmental influences, such as immersion liquids and the like, may be avoided. Only when, in turn, damage exceeding specific threshold values, for example, has occurred in the optically active area of the optical element can the optical element be rotated about the optical axis or about an axis parallel to it so that an undamaged, previously protected area is guided into the irradiated area where it is available for the imaging function. The protective layer or protective film need only be removed before or after the optical element has been rotated.

Accordingly, from a first aspect, the proposed principle can be applied in such a way that the optical element can be arranged already in an initially unused area or sector, such that, for example, it can take on an expected correction during the lifetime of imaging errors occurring in other neighbouring optical elements. For example, the outer contour in corresponding areas of the optical element which are not needed initially for optical imaging could be shaped such that they compensate for the expected service life damage of other optical elements after such a prepared area has been rotated into the ray path.

Apart from changes in the outer contour (sphere), it is also conceivable that in various areas (sectors), filters, especially different filters, such as grey filters, are deployed, corresponding anti-reflective layers or highly reflecting layers are deliberately detuned in order that, for example, a corresponding grey filter effect may be obtained, layer thickness adjustments are made in order that uniformity of the pupil may be improved and/or birefringent elements or areas are introduced to compensate for induced birefringence of the kind that occurs with some materials, such as $CaF_2$.

Accordingly, from a further aspect, this principle can be used to effect different modes of operation of an objective or an imaging device generally by corresponding rotation of one or more optical elements in the form of lenses and/or mirrors. For example, one or more such optical elements or a group of optical elements can be designed such that a certain operating mode is feasible with one part of the optical element, while other modes of operation can be realized with other parts or areas of the optical elements which can be introduced into the ray path by rotation.

An example of an operating mode to which this principle lends itself particularly well is the change between unpolarized light and tangentially polarized illumination. Here, for the corresponding modes of operation, the anti-reflective coatings for the refractive lenses or the highly reflective layers for the mirrors can be set for the tangentially polarized light or the unpolarized light.

The same applies, for example, for operation with or without immersion medium. In this case, for example, provision can be made for one area of one or more lenses to be designed for dry operation without immersion medium, while another unused area of the optical element(s) in a particular mounting position is prepared for operation with an immersion liquid, such that switching between these operating modes can be adjusted by corresponding rotation of the optical element(s).

The rotation or repositioning generally of the optical elements can proceed either manually or automatically, with, in the latter case, the optical elements having to be mounted on corresponding mounts and corresponding drives, such as electric motors and the like having to be provided. In the case of manual rotation, removal of the optical element and reinstallation in a rotated position is possible, with the result that complex mounting arrangements for rotation can be dispensed with.

Rotation of the optical elements must take into consideration whether the optical element possesses the necessary rotational symmetry. In the case of crystalline substances, such as $CaF_2$ lenses, which tend to have intrinsic birefringence, this must be taken into account for rotation. For example, in the case of a $CaF_2$ lens oriented in the <111> direction, only one rotation about the angle 120° and 240° is possible on account of the three-fold symmetry with regard to the otherwise occurring birefringence.

Specifically, this means that an objective of the type described includes at least one optical element, which has areas or sectors which are irradiated or through which radiation passes during imaging, while other areas or sectors are not located in the ray path.

Apart from these optical elements of the first kind, which can include both refractive elements, such as lenses, and reflective elements, such as mirrors, optical elements of a second kind, also in the form of reflective or refractive elements may additionally be provided, which are arranged so as to be immobile, especially fixed in position, in a corresponding housing of an objective.

The sectors or areas are configured in different ways in order that aging damage of other optical elements may be compensated and/or different operating modes may be facilitated.

Accordingly, the optical elements in the defined sectors or areas can be configured differently or configured from, or consist of, different parts. The differences between the sectors can exist or be realized in every respect, for example, by forming different external contours that can be used to compensate for expected imaging errors. Similarly, the formation of filters, especially grey filters, the modification of coatings, for example by varying the thickness as a way of generating certain filter properties here too, and fundamentally different coatings can be provided. Moreover, birefringent elements can be affixed in the various sectors or areas, or the sectors, areas or parts of the optical elements are made from different materials or the materials have different crystal orientations. Overall, all kinds of possibilities are conceivable as regards the different design of the areas or sectors or parts of the optical elements, with especially a combination of several possible measures conceivable as well.

Preferably, the different configuration of the sectors or areas can also be effected by providing corresponding protective measures, such as protective films and the like, for ensuring that those areas which are not used initially for the optical imaging initially remain intact. By means of corresponding apertures or projection devices, it can be ensured that certain sectors or areas are not irradiated.

In a preferred embodiment, the protective measures can be designed such that, after rotation of the corresponding area into the optical ray path, they are automatically dissolved, as is possible, for example, with film or coatings which are decomposed by corresponding light. In addition, photochemical processes can also be used, in which, in combination with corresponding impinging light and other chemicals, such as introduced oxygen or an immersion liquid which comes into contact with the optical element, the corresponding protective measures, such as protective coatings or films, can be dissolved.

The various modes of operation, which are made possible by the different design of the different sectors or areas, can preferably comprise operation under tangentially polarized illumination and unpolarized illumination, such that the transmission in the case of lenses and reflection in the case of mirrors can be set equally for both operating conditions.

In the same way, one operating mode with immersion fluid and one without an immersion liquid can be chosen as different operating modes, with, as a result of the different design of the corresponding areas of the optical elements, an optimal configuration created for both operating modes.

Accordingly, the conceivable modes of operation can include all modes of operation in which, by way of alternatives, different measures are adopted for the purpose of compensating or avoiding different imaging errors. This is particularly advantageous in the case of competing measures, such that, with the disclosed principle, to an extent depending on the use and application, emphasis can be placed on compensating for a different imaging error by corresponding rotation of the corresponding optical elements.

According to a preferred embodiment, several optical elements of the first kind, which are designed so as to be rotated or multiply positioned, can be grouped together, with especially all elements of a group being rotatable at the same time into the various mounting positions, preferably about the same angle of rotation.

BRIEF DESCRIPTION OF THE FIGURES

Further advantages, characteristics and features of the invention are apparent from the following description of preferred embodiments using the enclosed drawings. The drawings show in purely schematic form in FIG. 1 a plan view of an optical element before and after rotation.

DETAILED DESCRIPTION OF PREFERRED EMBODIMENTS

Figure 1:
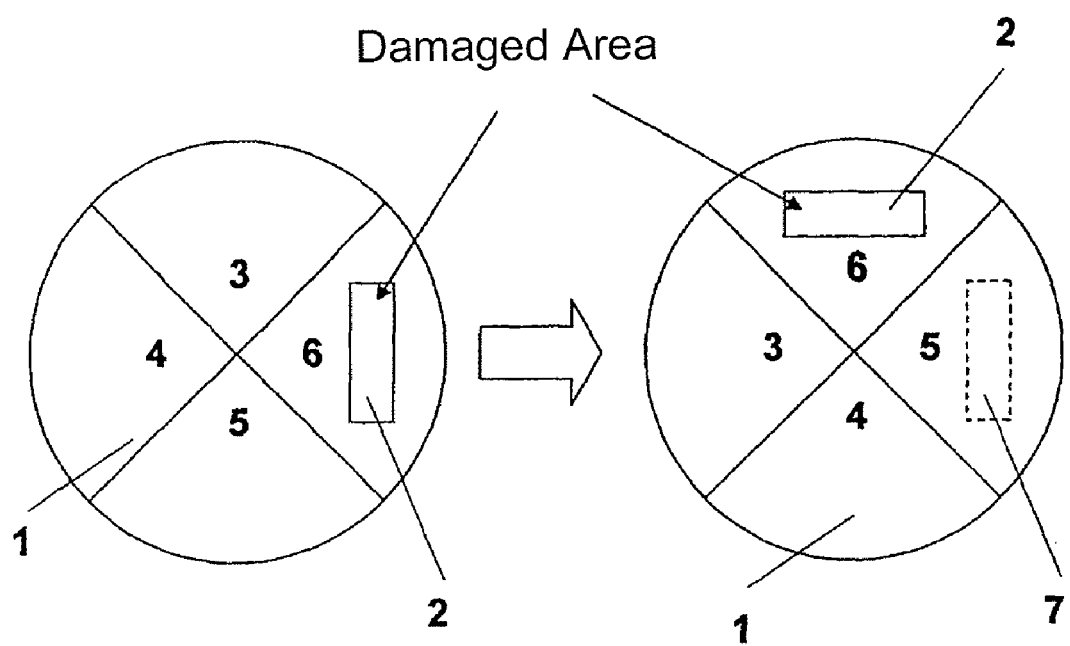

FIG. 1 shows an optical element in the form of lens 1, a rectangular area 2 of which is irradiated by the light used for imaging. As a result of the irradiation with light, such as ultraviolet light, the lens 1 undergoes degradation, for example, by compaction or rarefraction, such that the imaging properties, for example in terms of uniformity, are changed or impaired.

If this exceeds a certain threshold value, the lens 1 is rotated counterclockwise through 90° and/or re-positioned such that the damaged area 2 in the sector 6 is removed from the irradiation area 7, while the undamaged sector 5 is rotated into irradiation area or into the field area.

As may be seen from the schematically marked sectors 3 to 5, the lens 1 has four mounting positions, of which two mounting positions are shown in the drawing, more precisely first the mounting position in which the sector 3 is arranged in the top of the drawing, and a second mounting position in which the sector 6 is arranged in the top of the drawing. Further mounting positions arise when the sector 4 or the sector 5 is arranged in the upper part of the drawing.

Whereas in the related art, the lens 1 with the damaged area 2 would have been replaced, the life of the lens 1 can now be quadrupled, as four mounting positions are possible, in each of which the lens 1 can be operated until a certain degree of damage is reached.

Moreover, the sector 5 is designed differently compared to the previously used sector 6, such that the design of the sector 5 effects a correction in view of the present state of other optical elements.

Specifically, with knowledge of the lighting or the light employed, that is, the electromagnetic radiation generally, it can be concluded from the damage to sector 6 that other optical elements due to their radiation exposure have experienced degradation which can be compensated for in anticipation by sector 5. This has the advantage that only damage to the optical element 1 in the corresponding sector needs to be monitored and that rotation of the optical element 1 can automatically effect a correction of the expected damage to other optical elements.

This can be continued further such that, after damage to the optical element 1 in sector 5, the next unstressed sector, for example, sector 4 is rotated into the irradiation area 7, with the sector 4 then in turn being designed differently from the sectors 6 and 5 in order that the additional damage to other optical elements due to the irradiation period during which the sector 5 was arranged in the ray path may be compensated.

Since the damage to the other optical elements need not be a linear function of irradiation time, sector 4 can be designed to allow for the change over the irradiation time.

In addition, the optical element 1 in the form of an optical lens with its sectors 3 to 6 can also be designed such that, through the different configurations of the sectors 3 to 6, different modes of operation can be accommodated. Depending on which operating mode is to be chosen, the different sectors 3 to 6 can be brought into the irradiated area 7 in order that the imaging device may image in a manner appropriate to the operating mode.

Figure 2:
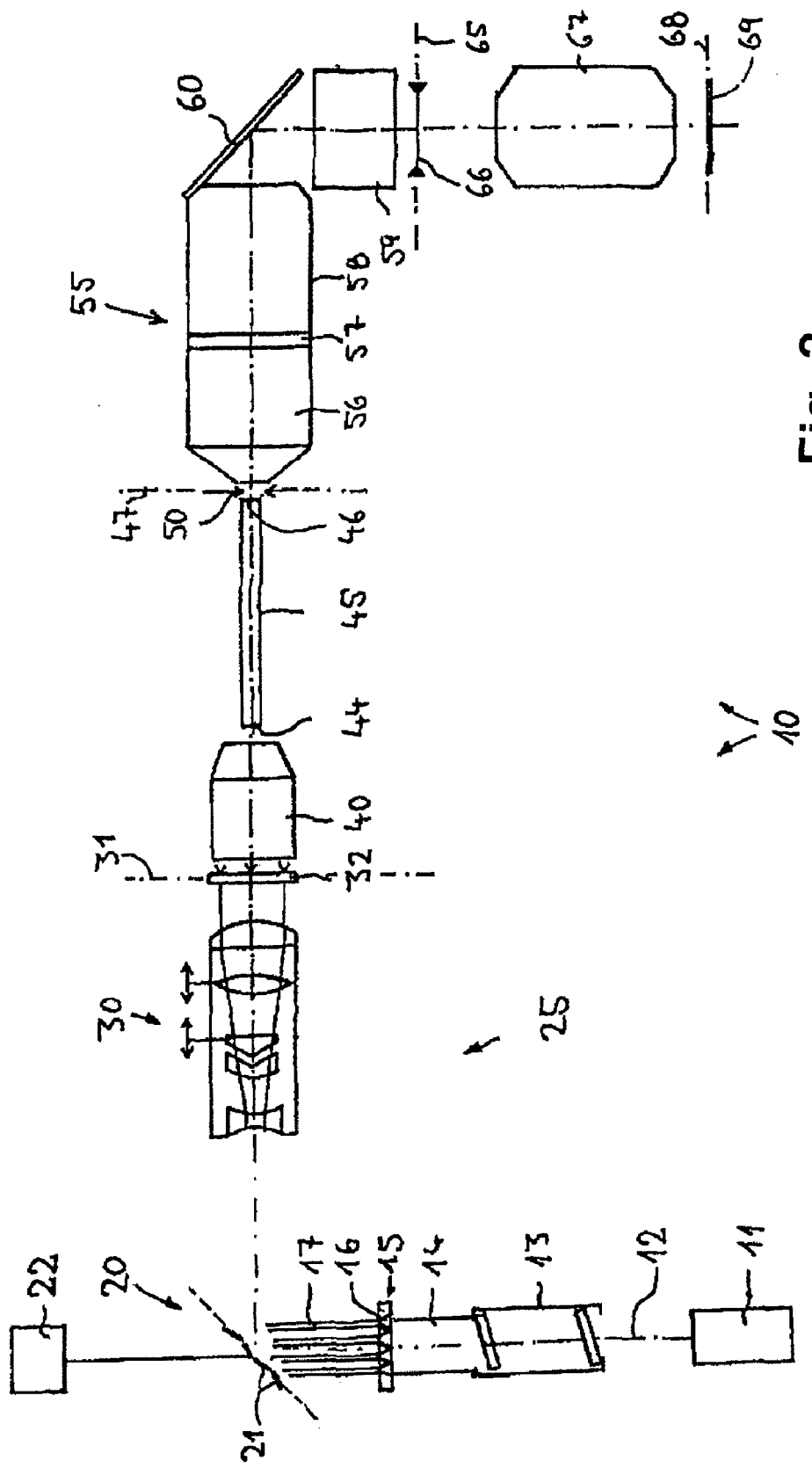
FIG. 2 a view of a projection exposure system, in which the invention can be implemented in an illumination system; and in FIG. 3 a view of an off-axis projection objective in which the invention can be used.

FIG. 2 shows a projection exposure system, in which an embodiment of the present invention can be used in the form of, for example, the rotating optical lens 1.

The projection exposure system 10, shown in FIG. 2, is described in detail in the German published patent application DE 103 43 333 A1, the disclosure of which is hereby incorporated herein by reference in its entirety.

The projection exposure system 10 of FIG. 2 has a light source 11, whose light is directed to a zoom Axicon objective 30 via a light distribution device 25 with beam expander 13, raster arrangement 15, and mirror arrangement 20. The light can have a wavelength of around 157 nm or other wavelengths in the region of 139 nm, 248 nm, etc. The light sources for this purpose are $F_2$ excimer lasers or ArF excimer lasers.

Behind the pupil forming surface 31, the illumination system has a coupling optics 40, which transmits the light further into an objective 55 via a rod-like light integrator. In the objective 55, there is a pupil intermediate level at 57, in which a lens can be arranged in accordance with an embodiment of the present invention.

After the illumination system, the light impinges in the reticle plane 65 on the reticle 66, which is illuminated homogeneously by the illumination system. The reticle 66 is located in the object plane of the projection objective 67, which images the reticle onto the wafer 69 in the image plane 68.

Instead of the arrangement of an optical lens in an illumination system, as shown in FIG. 2, a correspondingly designed lens or a mirror can also be provided in a projection objective. An example of this is given in FIG. 3, which shows a so-called off-axis projection objective for the imaging of a reticle 101 into the image plane 103. The off-axis projection objective shown in FIG. 3 is described in detail in US 2006/0077366 A1, the disclosure of which is hereby incorporated herein by reference in its entirety.

Figure 3:
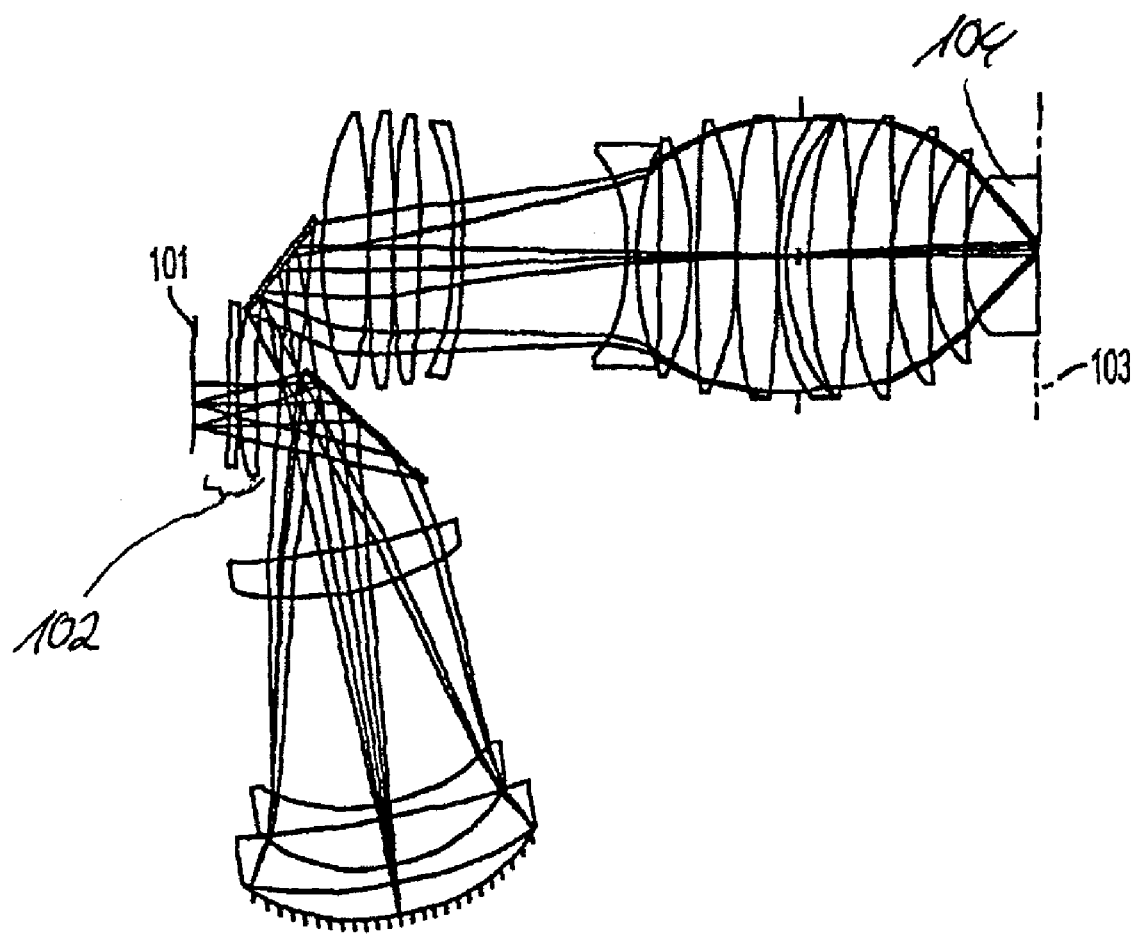

In the catadioptric projection objective of FIG. 3 with refractive and reflective optical elements, optical elements in accordance with inventive embodiments, such as lenses and mirrors, can find use especially in field planes or planes close to the field, since such off-axis objectives have a limited illumination field which is offset from the optical axis. Accordingly, in the projection objective shown in FIG. 3, the two optical elements immediately after the reticle 101 and labelled with reference symbols 102 and the optical element 104 in the immediate vicinity of the image plane 103 lend themselves to this.

Although the present invention has been described in detail in the embodiments, it is clear to a person skilled in the art that modifications or changes, particularly as regards different combinations of individual features or the omission of individual features, are possible, without departing from the protective scope of the enclosed patent claims The applicant seeks, therefore, to cover all such changes and modifications as fall within the spirit and scope of the invention, as defined by the appended claims, and equivalents thereof.

The invention claimed is:

1. Objective, comprising:
a plurality of optical elements that are arranged along a ray path, including at least one optical element of a first kind, which is irradiated only partially by a ray bundle,
wherein the at least one optical element of the first kind is rotatably mounted or positioned about the optical axis or an axis parallel to the optical axis,
wherein, for the optical element of the first kind, at least two mounting positions are provided,
wherein the rotation angle between the two mounting positions is defined by the surface irradiated by the ray bundle such that, in the two mounting positions, the surfaces irradiated by the ray path do not overlap,
wherein the at least one optical element is a lens or a mirror,
wherein the at least one optical element includes areas which each correspond respectively to the mounting positions, which each cover the respective surfaces irradiated by a ray bundle,
wherein the areas differ in design, and
wherein the areas differ in at least one of filter characteristic, detuned coating, coating layer thickness, coating characteristic, birefringency, material, and crystal orientation.

2. Objective according to claim 1, configured as a projection objective or as an illumination objective for microlithography for imaging a reticle onto a wafer.

3. Objective according to claim 1, wherein the at least one optical element is formed to compensate for aging damage to other optical elements of the objective.

4. Objective according to claim 1, further comprising at least one optical element of a second kind, which is a refractive or reflective element, and which is provided immobile in a housing of the objective.

5. Objective according to claim 1, wherein the areas differ additionally in outer contour.

6. Objective according to claim 1, wherein at least one the areas comprises a protective layer.

7. Objective according to claim 6, wherein the protective layer is configured to dissolve by at least one of irradiation or a predetermined photochemical process.

8. Objective according to claim 1, wherein at least two of the areas are configured for two differing modes of operation.

9. Objective according to claim 8, wherein the operating modes comprise at least one of (i) a tangentially polarized illumination and an unpolarized illumination, (ii) operation with and without immersion liquid, and (iii) alternative measures for compensating imaging errors.

10. Objective according to claim 1, wherein a plurality of optical elements of the first kind are grouped together and are mounted to rotate into different mounting positions simultaneously.

11. Objective according to claim 1, wherein a plurality of optical elements of the first kind are grouped together and are mounted to rotate into different mounting positions about a same angle of rotation.

12. Objective according to claim 1, wherein the at least one optical element of the first kind is composed of several parts in accordance with the areas.

13. Objective according to claim 1, wherein a last element of the optical elements is formed directly opposite the wafer as the at least one optical element of the first kind.

14. Objective, comprising:
a plurality of optical elements that are arranged along a ray path, including at least one optical element of a first kind, which is irradiated only partially by a ray bundle, wherein the at least one optical element of the first kind is rotatably mounted or positioned about the optical axis or an axis parallel to the optical axis, wherein, for the optical element of the first kind, at least two mounting positions are provided, wherein the rotation angle between the two mounting positions is defined by the surface irradiated by the ray bundle such that, in the two mounting positions, the surfaces irradiated by the ray path do not overlap, wherein the at least one optical element is a lens or a mirror, wherein the at least one optical element includes areas which each correspond respectively to the mounting positions, which each cover the respective surfaces irradiated by a ray bundle, wherein the areas differ in design, wherein at least two of the areas are configured for two differing modes of operation, and wherein the operating modes comprise at least one of (i) a tangentially polarized illumination and an unpolarized illumination, and (ii) operation with and without immersion liquid.

15. An objective, comprising:

a plurality of optical elements arranged along a ray path, including at least one first optical element and at least one second optical element, said first optical element comprising a plurality of non-overlapping subsections, and a mount for the first optical element, said mount having a plurality of settings for the first optical element, and said mount positioning only one respective one of the subsections into the ray path at a time in each of the settings, wherein the at least one first optical element is a lens or a mirror:

wherein the subsections of the first optical element mutually differ in at least one of: filter characteristic, detuned coating, coating layer thickness, coating characteristic, birefringency, material, and crystal orientation.

* * * * *

UNITED STATES PATENT AND TRADEMARK OFFICE
CERTIFICATE OF CORRECTION

PATENT NO. : 8,339,575 B2  
APPLICATION NO. : 12/206550  
DATED : December 25, 2012  
INVENTOR(S) : Alexandra Pazidis et al.

Page 1 of 1

It is certified that error appears in the above-identified patent and that said Letters Patent is hereby corrected as shown below:

In the Claims

Column 8, line 38: in Claim 6, delete "one the" and insert -- one of the --.

Signed and Sealed this  
Eleventh Day of June, 2013

Teresa Stanek Rea  
*Acting Director of the United States Patent and Trademark Office*